(12) United States Patent
Kleinecke et al.

(10) Patent No.: US 10,448,544 B1
(45) Date of Patent: Oct. 15, 2019

(54) SELF-COOLED DRAWOUT POWER MODULE WITH ISOLATED THERMOSIPHON HEAT EXCHANGER

(71) Applicant: Toshiba International Corporation, Houston, TX (US)

(72) Inventors: John David Kleinecke, Houston, TX (US); Leonard Jack Davis, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 0 days.

(21) Appl. No.: 15/957,400

(22) Filed: Apr. 19, 2018

(51) Int. Cl.
*H05K 5/00* (2006.01)
*H05K 7/20* (2006.01)
*H05K 7/16* (2006.01)
*H05K 5/06* (2006.01)
*H05K 7/14* (2006.01)

(52) U.S. Cl.
CPC ......... *H05K 7/20918* (2013.01); *H05K 5/069* (2013.01); *H05K 7/1432* (2013.01); *H05K 7/16* (2013.01); *H05K 7/20145* (2013.01); *H05K 7/20936* (2013.01)

(58) Field of Classification Search
CPC ....................................... H05K 5/00
See application file for complete search history.

(56) References Cited

U.S. PATENT DOCUMENTS

| 7,256,995 B2 * | 8/2007 | Wrycraft | H05K 7/1488 361/695 |
| 2014/0071626 A1 * | 3/2014 | Campbell | B23P 15/26 361/700 |

* cited by examiner

*Primary Examiner* — Jerry Wu
(74) *Attorney, Agent, or Firm* — Baker Botts L.L.P.

(57) ABSTRACT

The presently disclosed embodiments are directed to an improved mechanical arrangement of a drawout power module system that prevents outside contaminants from being deposited on the electronic components in the power module. A need exists for an improved mechanical arrangement of a power module and cabinet that would prevent the contaminants from outside of the cabinet from being deposited on the electronic components in the power module. To that end, the outdoor drive may include a cabinet with an air intake and an air outlet located on said cabinet and in fluid communication with an interior space of said cabinet, wherein said cabinet is configured to receive a power module within said interior space. The power module may include an environmentally sealable chamber where outside air can enter and exit only said environmentally sealable chamber of said power module.

17 Claims, 9 Drawing Sheets

US 10,448,544 B1

SELF-COOLED DRAWOUT POWER MODULE WITH ISOLATED THERMOSIPHON HEAT EXCHANGER

TECHNICAL FIELD

Embodiments of the present disclosure relate to outdoor drives and power systems and, more particularly, to systems and methods for self-cooled drawout power modules with isolated thermosiphon heat exchangers.

BACKGROUND

Outdoor drives are power controllers for heavy outdoor use. Typically, outdoor drives contain power modules that are housed in cabinets in order to protect the modules from the external elements. Such outdoor drives are used to power equipment at sites in harsh environments with temperatures ranging from cold arctic environments to hot desert environments. Such sites include, but are not limited to, oil well sites.

Power modules typically contain sensitive electronics that are required for the outdoor drive to work. The electronic components are prone to overheating and must be cooled in order to prevent damage. One common design is to connect the electronic components to a heatsink placed in the power module. Specifically, such designs often connect the evaporator portion of the heatsink to the electronic components and leave the condenser portion exposed to the air inside of the cabinet. This allows the heat to be drawn out of the electronic components, into the heatsink, then into the air in the cabinet.

Such designs often require air from outside of the cabinet to be drawn across the heatsink to ensure that relatively cooler air is in contact with the heatsink. This, in turn, requires air from outside of the cabinet to be drawn through the power module. After passing through the condenser portion of the heatsink, the air often is exhausted to the outside of the cabinet.

SUMMARY

In accordance with the above, the presently disclosed embodiments are directed to an improved mechanical arrangement of a drawout power module system that prevents outside contaminants from being deposited on the electronic components in the power module. The problem with the above described designs for cooling electronic components of a power module is that the outside air, which is used to draw the heat out of the heatsink, can contain dust, debris, and other contaminants that may damage the sensitive electronics in the power module. This problem is caused by a design limitation in power modules that allows air to flow not only across the heatsink of the module but also across other more sensitive components of the module. If moisture or other contaminants are present in the external air, then they will be deposited on the sensitive components of the module. Therefore, it is now recognized that a need exists for an improved mechanical arrangement of the power module and cabinet that would prevent the contaminants from outside of the cabinet from being deposited on the electronic components in the power module.

To that end, in some embodiments, the outdoor drive may include a cabinet with an air intake and an air outlet located on a first wall of said cabinet and in fluid communication with an interior space of said cabinet, wherein said cabinet is configured to receive a power module within said interior space. The power module may include a chamber containing electronic components, an environmentally sealable chamber containing a first opening configured to receive air from said air intake, a second opening configured to allow air to exit through said air outlet, a heatsink thermally coupled to said electronic components in said chamber, a fan capable of circulating air from said air intake over said heat sink and out said air outlet, and a plurality of module securing arms capable of securing said first and second openings of said environmentally sealable chamber with said air inlet and said air outlet on said first wall of said cabinet, thereby allowing air to enter and exit only said environmentally sealable chamber of said power module.

The above module securing arms may include a rod having a first end with threads. This allows the rod to screw into a threaded securing bracket that is attached to the cabinet. This allows the module securing arm to tighten the power module against the cabinet wall with the air intake and air outlet. Additionally, the power module may use a plurality of such module securing arms. In some embodiments, two are located above said environmentally sealable chamber and two are located below said environmentally sealable upper chamber. To assist in creating a seal between the power module and cabinet wall, said first wall or said environmentally sealable chamber may include a gasket thereby creating an environmental seal between said first wall and said environmentally sealable upper chamber of said power module.

Also, the presently disclosed embodiments are directed to an improved mechanical arrangement that would facilitate the removal of the power module from the cabinet. Another problem with such systems is the difficulty involved in removing large, heavy power modules from the cabinets for servicing and maintenance. Often, removing a power module is a time-consuming and burdensome task. Thus, it is now recognized that a need exists for an improved mechanical arrangement of the cabinet and power module that would facilitate the removal of the power module from the cabinet.

To that end, the cabinet of the outdoor drive may include a support tray that is hingedly connected to said cabinet wherein said support tray is capable of supporting said power module, and wherein said support tray has guide tracks capable of allowing said power module to slide into said interior space of said cabinet.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation-specific decisions must be made to achieve the developers' specific goals, such as compliance with system related and business-related constraints, which will vary from one implementation to another. Moreover, it will be appreciated that such a development effort might be complex and time consuming but would nevertheless be a routine undertaking for those of ordinary skill in the art having the benefit of the present disclosure. Furthermore, in no way should the following examples be read to limit, or define, the scope of the disclosure.

Figure 1:
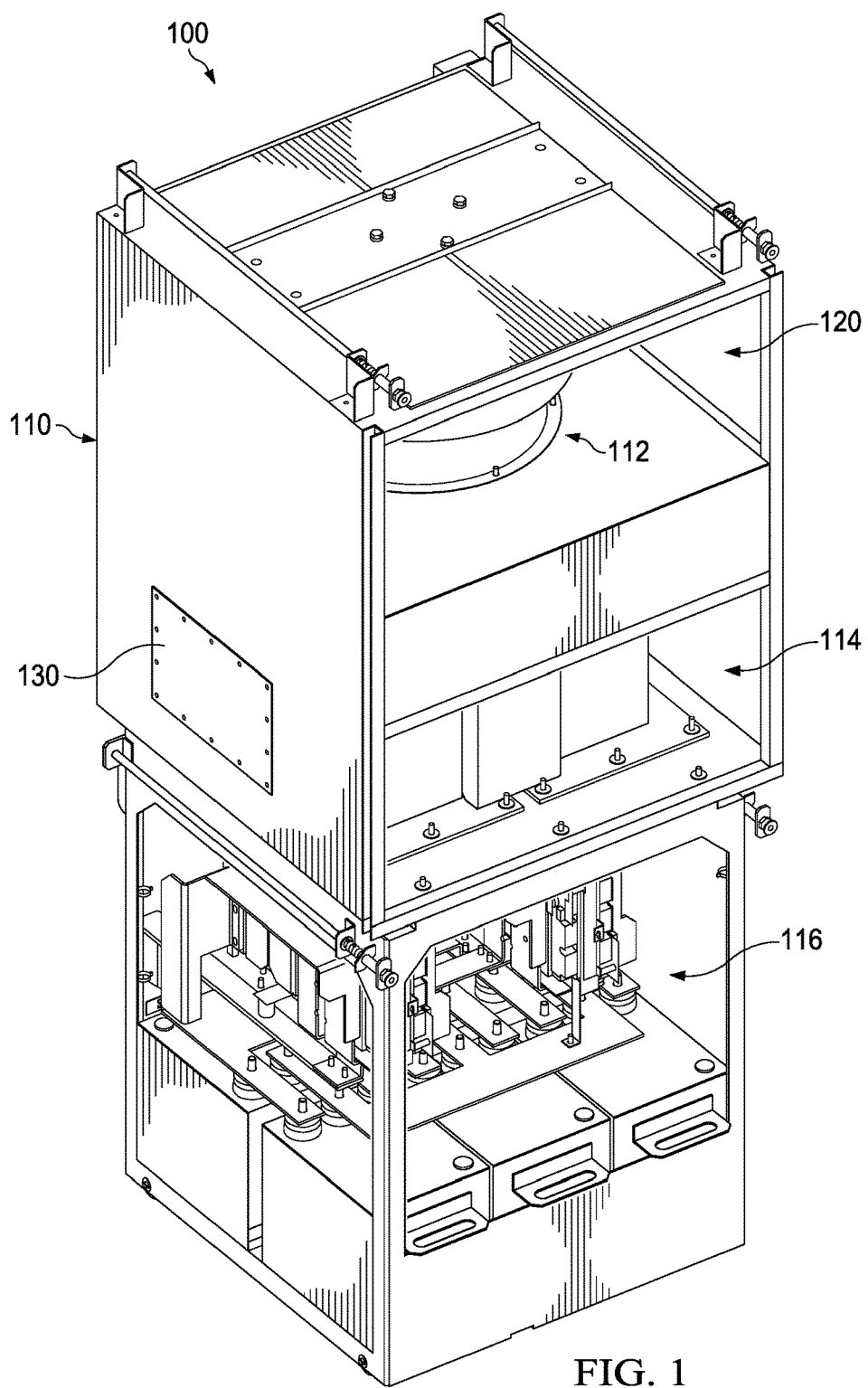
FIG. 1 is a view of the outside exterior of a power module, in accordance with certain embodiments of the present disclosure.
Figure 2:
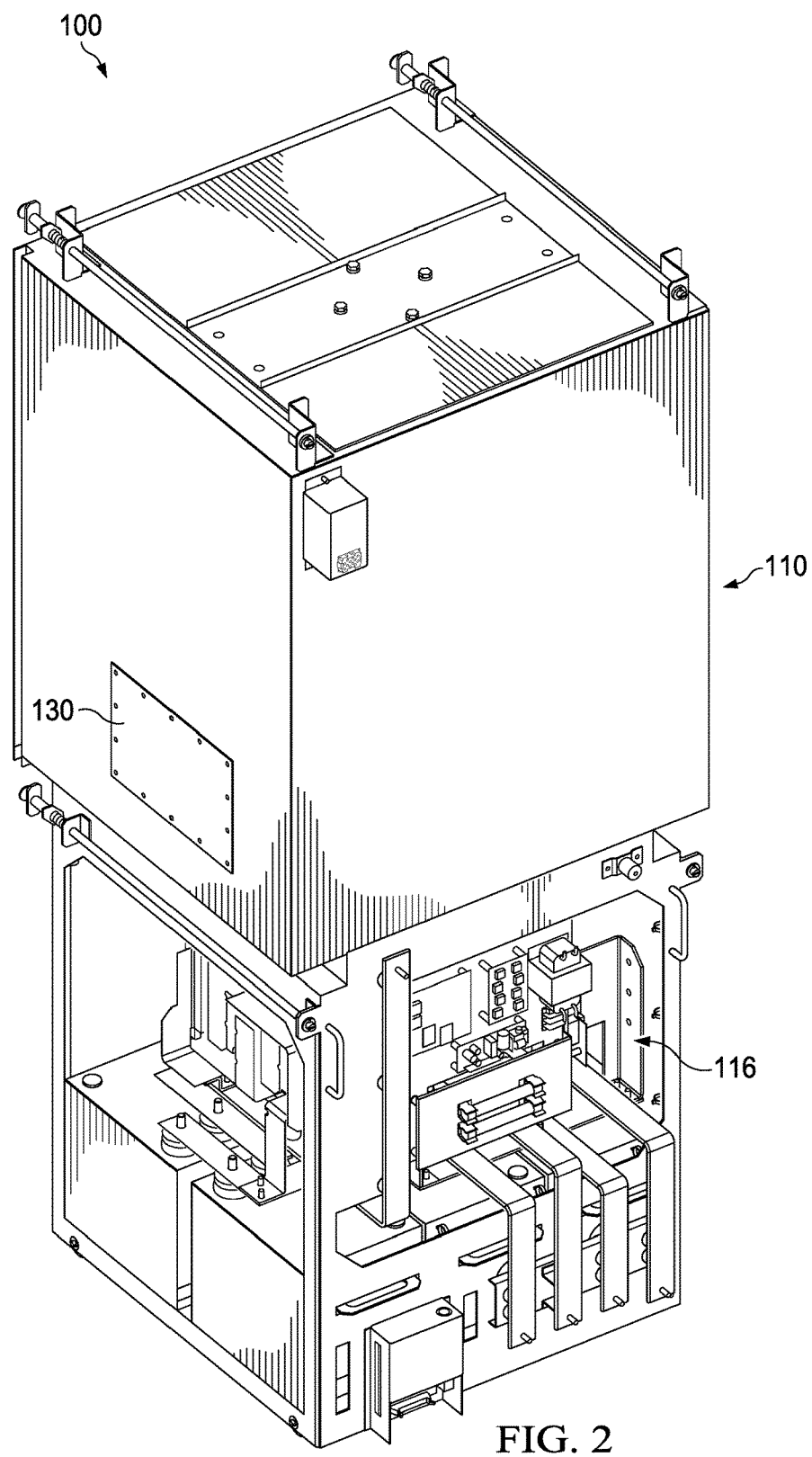
FIG. 2 is an opposite view of the outside exterior of a power module in FIG. 1, in accordance with certain embodiments of the present disclosure.

Turning now to the drawings, referring to FIGS. 1 and 2, this disclosure is directed to an improved mechanical arrangement that may have a drawout power module 100 incorporating an environmentally sealable chamber 110 with at least one opening 120. The environmentally sealable chamber 110 contains a cooling fan 112 and a heatsink 114. In some embodiments, the cooling fan may be located external to the chamber 110. In some embodiments, heatsink 114 may be the condenser portion of a heat exchanger. In embodiments where heatsink 114 is a condenser portion, the condenser portion 114 may be electrically isolated from the evaporator portion (not shown), to which high voltage power devices 116 may be attached. Additionally, environmentally sealable chamber 110 may have a sealable access point 130, which may be sealed when operating but may be removed to allow for periodic cleaning of the fins of heatsink 114.

In some embodiments, the heat exchanger may be a thermosiphon heat exchanger. The thermosiphon heat exchanger may work by first conducting heat away from the electronic devices 116, which in some embodiments may be attached to the lower surface of environmentally sealable chamber 110. As one of ordinary skill in the art would appreciate, this heat may be then absorbed into the fluid inside the evaporator (not shown) of the heat exchanger, which then evaporates and travels to the condenser 114 of the heat exchanger. In such embodiments, as one of ordinary skill may appreciate, relatively cooler air from outside the cabinet 300 (shown in FIG. 3) may run along the external loop of the condenser 114, thereby cooling the gas inside condenser 114 and causing the gas to condense into a fluid and travel down to the evaporator. As a person of ordinary skill would appreciate, the fluid flow from evaporator, to condenser, and back to evaporator, forms a cycle that is commonly found in heat exchangers. This cycle may allow the sensitive electronic components 116 attached to the heat exchanger to be cooled without having the sensitive electronic components 116 contacting air from outside of the cabinet.

Figure 3:
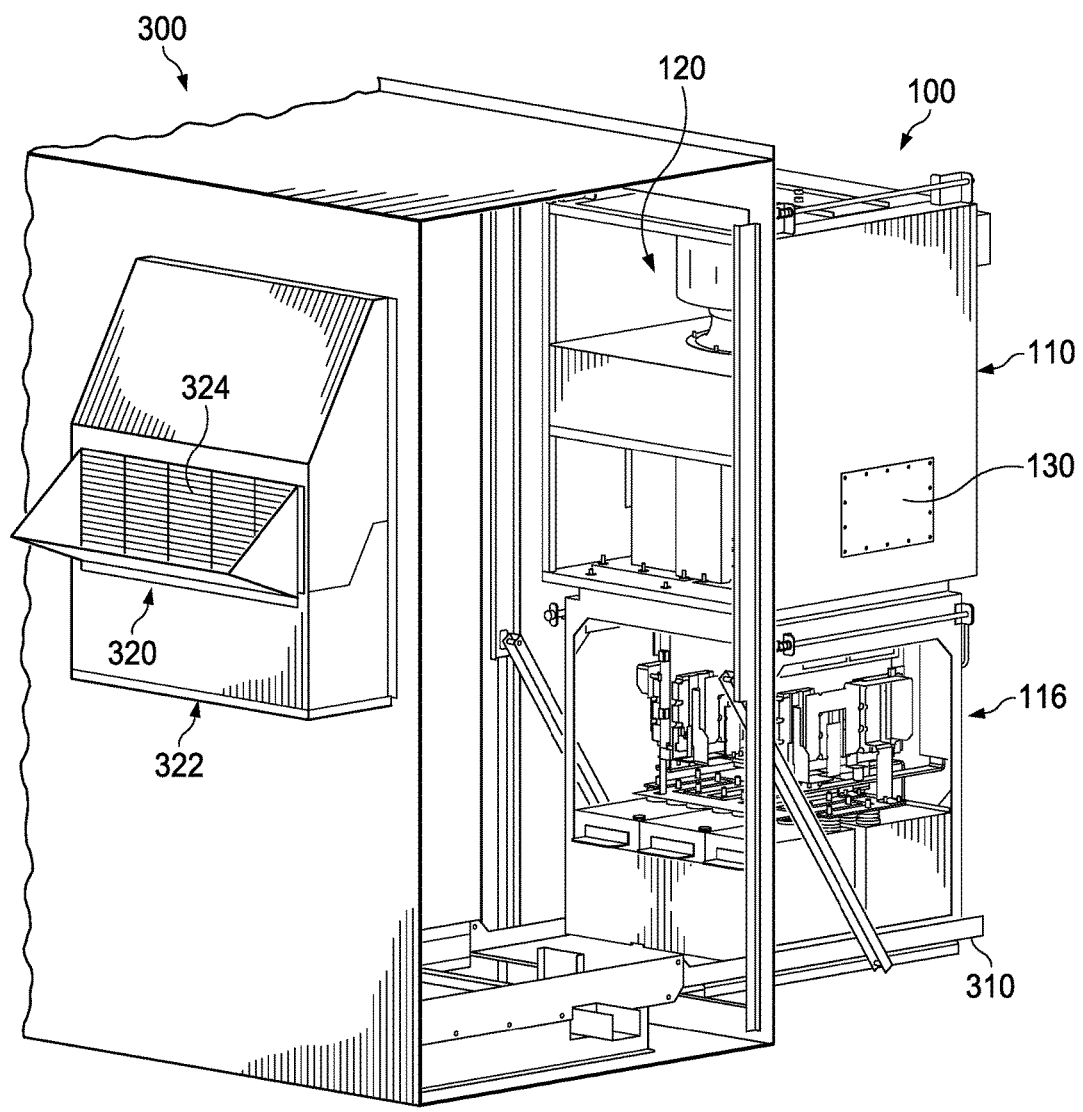
FIG. 3 is a view of a power module loaded into a tray support of a cabinet, in accordance with certain embodiments of the present disclosure.
Figure 4:
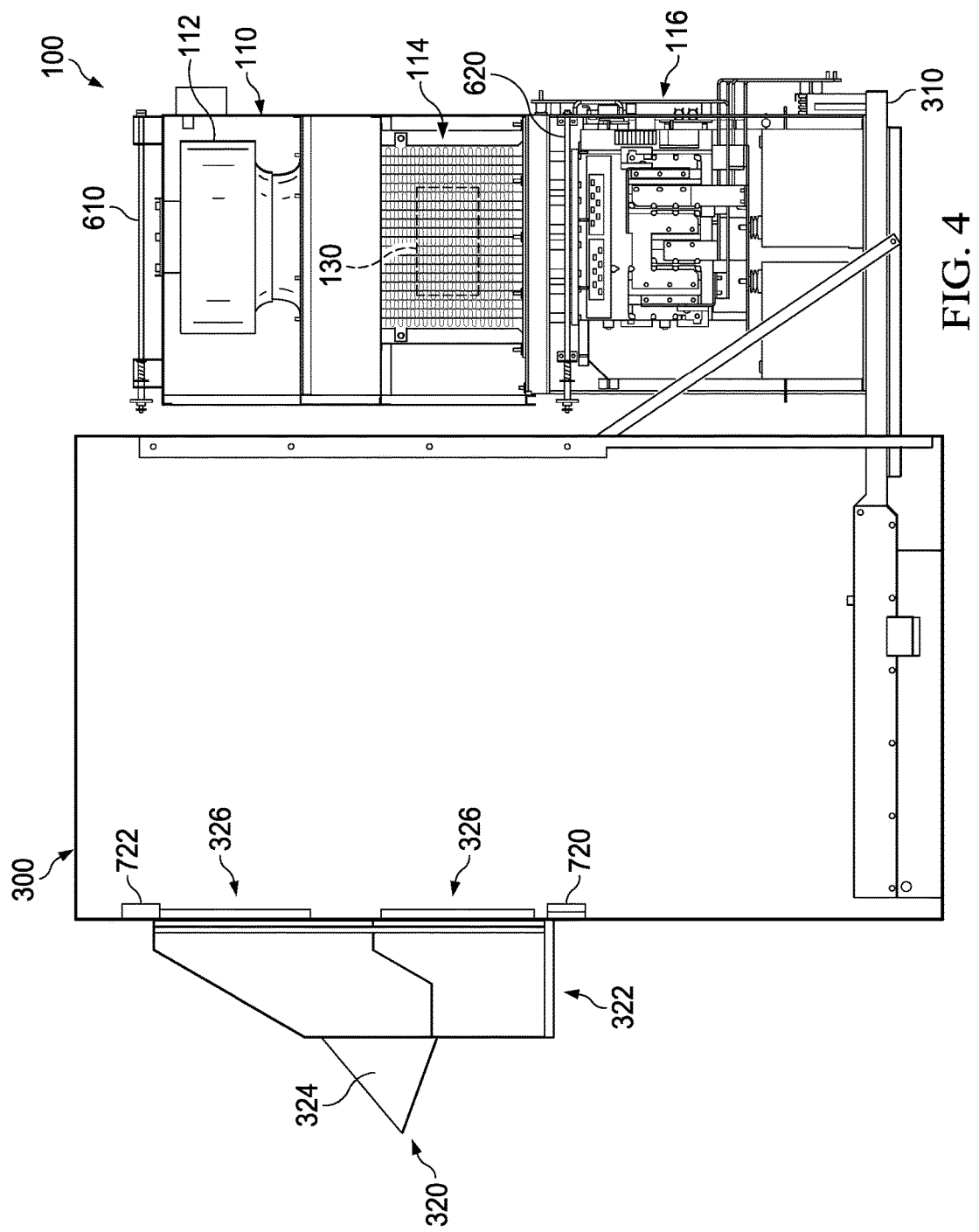
FIG. 4 is a cross-sectional view of the power module and cabinet of FIG. 3, in accordance with certain embodiments of the present disclosure.

Referring to FIGS. 3 and 4, the module 100 may be loaded onto tray support 310 of cabinet 300. A person of ordinary skill would appreciate that module 100 may be loaded onto tray support 310 by way of heavy lifting equipment such as a forklift or a power module lifting device (not shown). In some embodiments, tray support 310 may be of the form of a folding tray. After being loaded onto tray support 310, module 100 may be pushed into the interior space of cabinet 300 until environmentally sealable chamber 110 is flush with cabinet openings 326. Cabinet openings 326 may include an air intake 322 and an air outlet 324 as part of exhaust 320. In some embodiments, air intake 322 may have a filter (not shown) that filters air travelling through air intake 322.

Figure 5:
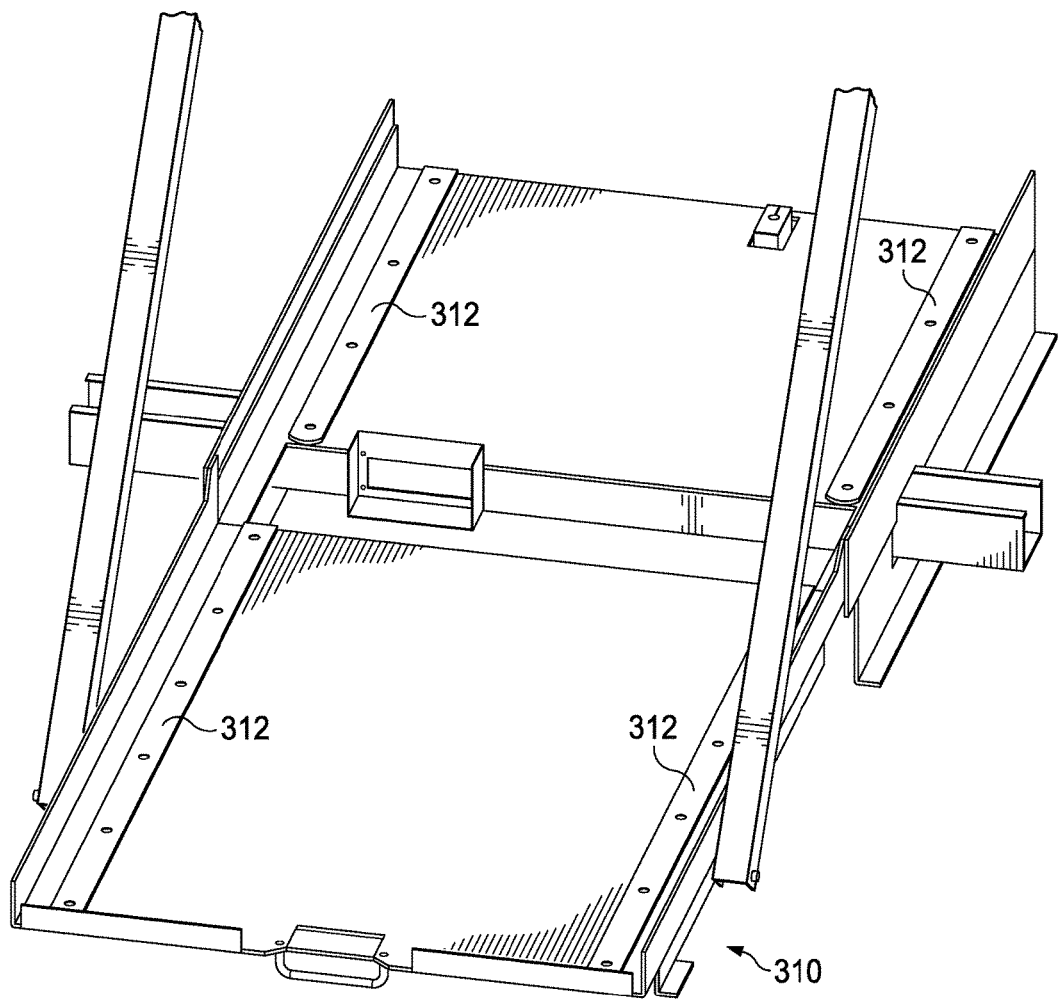
FIG. 5 is a close-up view of a folding tray, in accordance with certain embodiments of the present disclosure.

Referring to FIG. 5, there may be tracks 312 installed on top of tray support 310 that facilitate the sliding of power module 100 into the interior space of cabinet 300. In the particular embodiment disclosed in FIG. 5, tray support 310 takes the form of a folding tray with tracks 312. Additionally, the underside of power module 100 (not shown) may have tracks that are complimentary to tracks 312 and additionally facilitate the sliding of power module 100 into the interior space of cabinet 300. A person of ordinary skill would appreciate that there are many mechanisms by which power module 100 could slide over tracks 312, such as wheels, rollers, or sliders.

Figure 6:
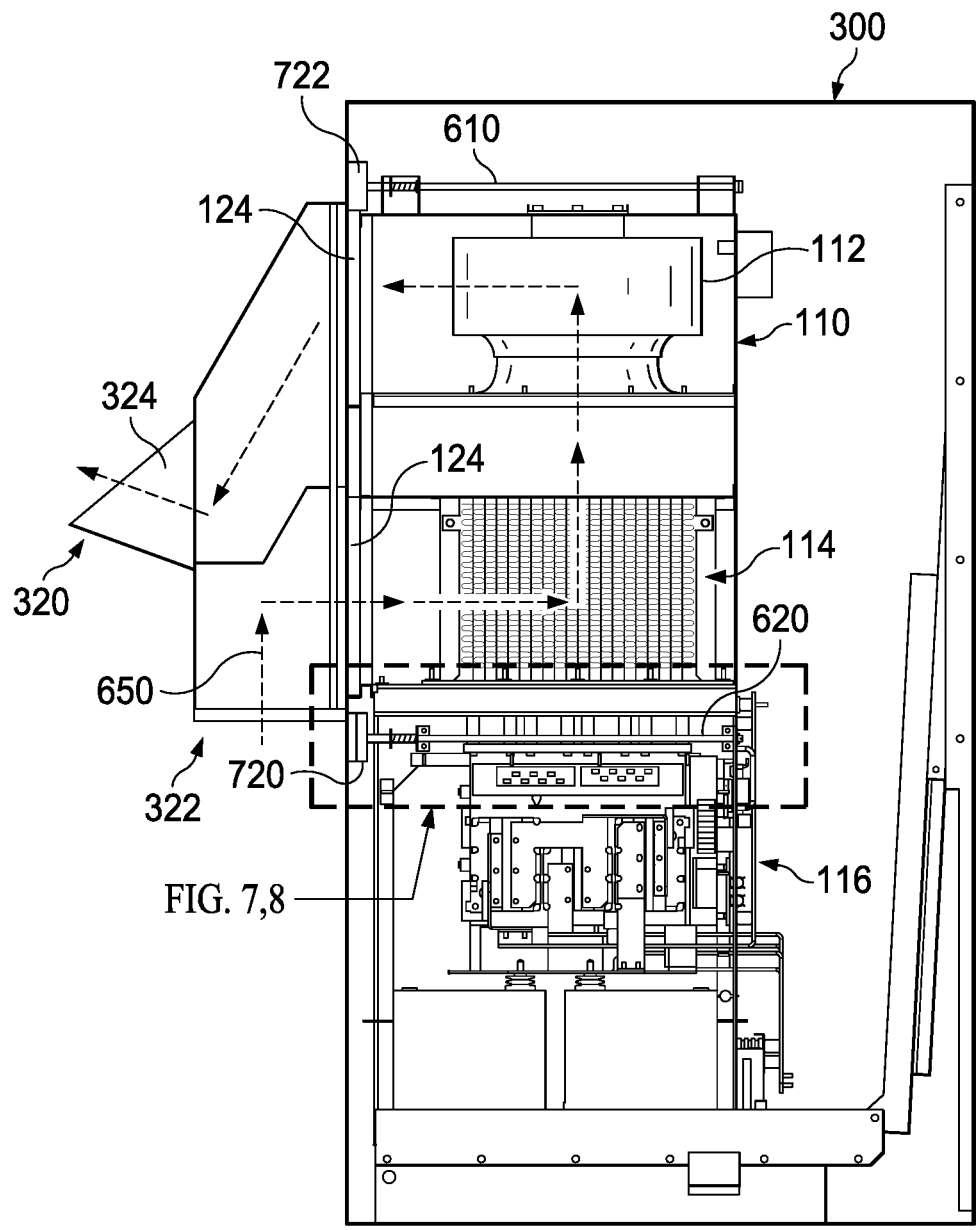
FIG. 6 is a cross-sectional view of a power module that is disposed in the interior space of a cabinet, in accordance with certain embodiments of the present disclosure.

Referring to FIG. 6, after module 100 is pushed into the interior space of cabinet 300, which may make environmentally sealable chamber 110 flush with cabinet openings 326, module securing arms 610 and 620 may be engaged to seal the environmentally sealable chamber 110 of module 100 with cabinet openings 326. As shown in FIG. 6, in some embodiments, module securing arms 610 may be located at the top of environmentally sealable chamber 110 while module securing arms 620 may be located at the bottom of environmentally sealable chamber 110. However, as a person of ordinary skill in the art would appreciate, the same sealing affect can be achieved with any number of module securing arms located anywhere on module 100. As described further in FIGS. 7-9, in some embodiments, module securing arms 610 and 620 are engaged by screwing them clockwise into securing brackets 722 and 720 respectively on an interior wall of cabinet 300. However, a person of ordinary skill would appreciate that there are many locking or latching mechanisms by which module securing arms 610 and 620 may be engaged with securing brackets 720 and 722, such as threaded locking mechanisms, slam latches, or cam locks.

After engaging module securing arms 610 and 620, the at least one opening 120 of environmentally sealable chamber 110 may form a seal 124 with cabinet openings 326. In some embodiments, cabinet 300 or environmentally sealable chamber 110 may be fit with a gasket (not shown) to make seal 124 airtight or watertight. A person of ordinary skill in the art would appreciate that there are many types of materials that may be used for such a gasket, such as an elastomeric material. Additionally, a person of ordinary skill in the art would appreciate that there are many options for placing the gasket in the mechanical configuration to achieve the same affect, such as placing the gasket on the interior cabinet wall or placing it along the rim of opening 120. The purpose of seal 124 is to ensure that air from outside of cabinet 300 passes only into environmentally sealable chamber 110. Consequently, in this particular embodiment, seal 124 may operate such that, when module securing arms 610 and 620 are engaged with securing brackets 722 and 720 respectively, seal 124 may prevent outside air from contacting the electronic devices 116, which in turn may protect the electronic devices 116 from contaminants outside of cabinet 300. Further, seal 124 may operate such that only fan 112 and condenser 114 inside of environmentally sealable chamber 110 would be exposed to contaminants present from the air outside of cabinet 300.

Air pathway 650 shows a particular embodiment of the path that outside air may take through air inlet 322, over heatsink 114, through fan 112, and out air outlet 324. In this particular embodiment, seal 124 prevents air pathway 650 from encountering electronic components 116. In other embodiments, once seal 124 is created by engaging module securing arms 610 and 620, air may flow into and out of environmentally sealable chamber 110 in a manner not shown in FIG. 6. In some embodiments, air outside of cabinet 300 may be drawn in through air intake 322 by fan 112. In some embodiments, fan 112 may continue driving the outside air over the condenser portion of heatsink 114 and then out air outlet 324. In such embodiments, the pathway of the air occurs only in environmentally sealable chamber 110 and does not in any way contact electronic components 116. In addition, air intake 322 may be filtered to ensure that larger contaminants are not allowed to penetrate the heat exchanger fins.

Figure 7:
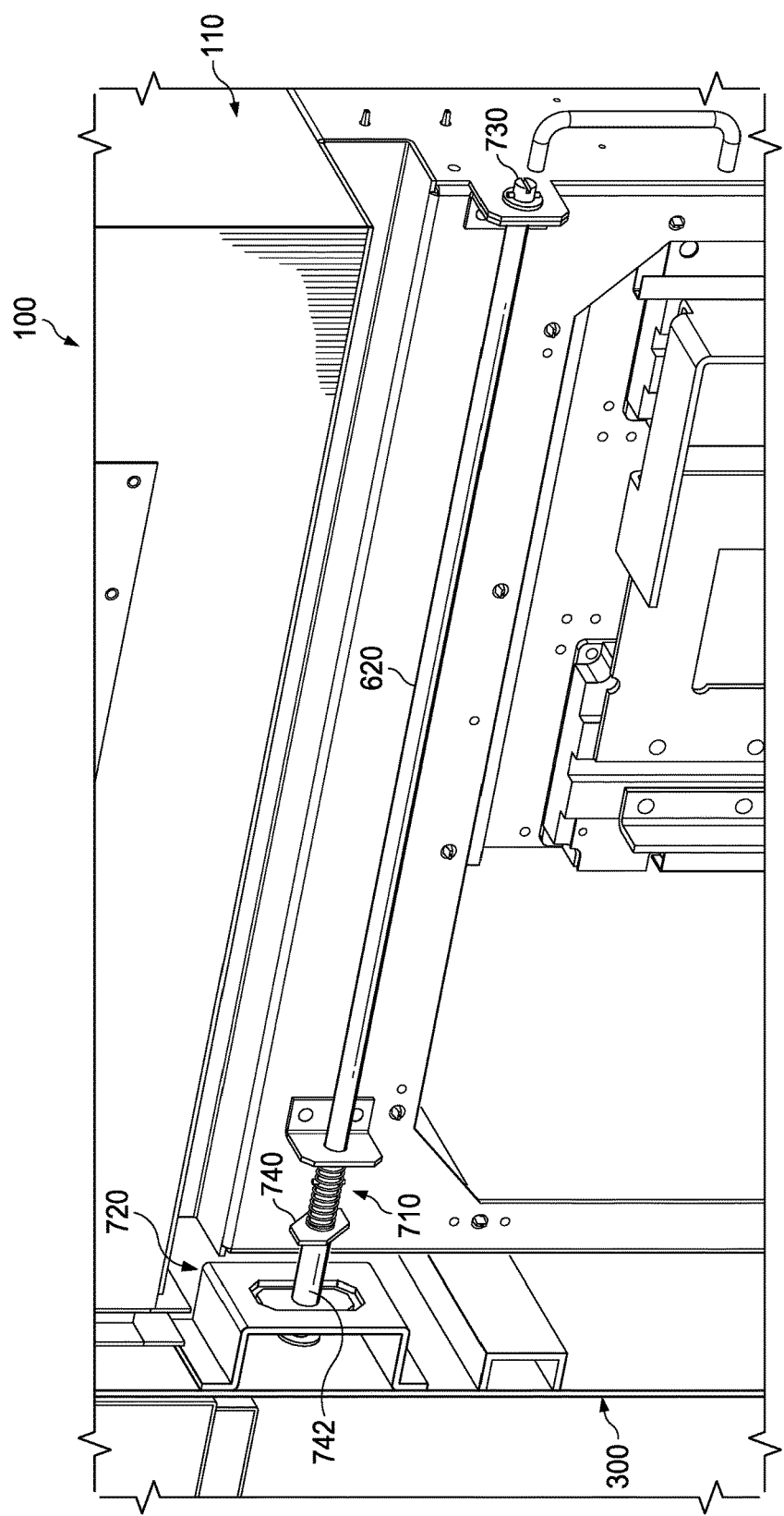
FIG. 7 is a close-up side view of a module securing arm in initial contact with a securing bracket with locking angle in an unlocked position, in accordance with certain embodiments of the present disclosure.
Figure 8:
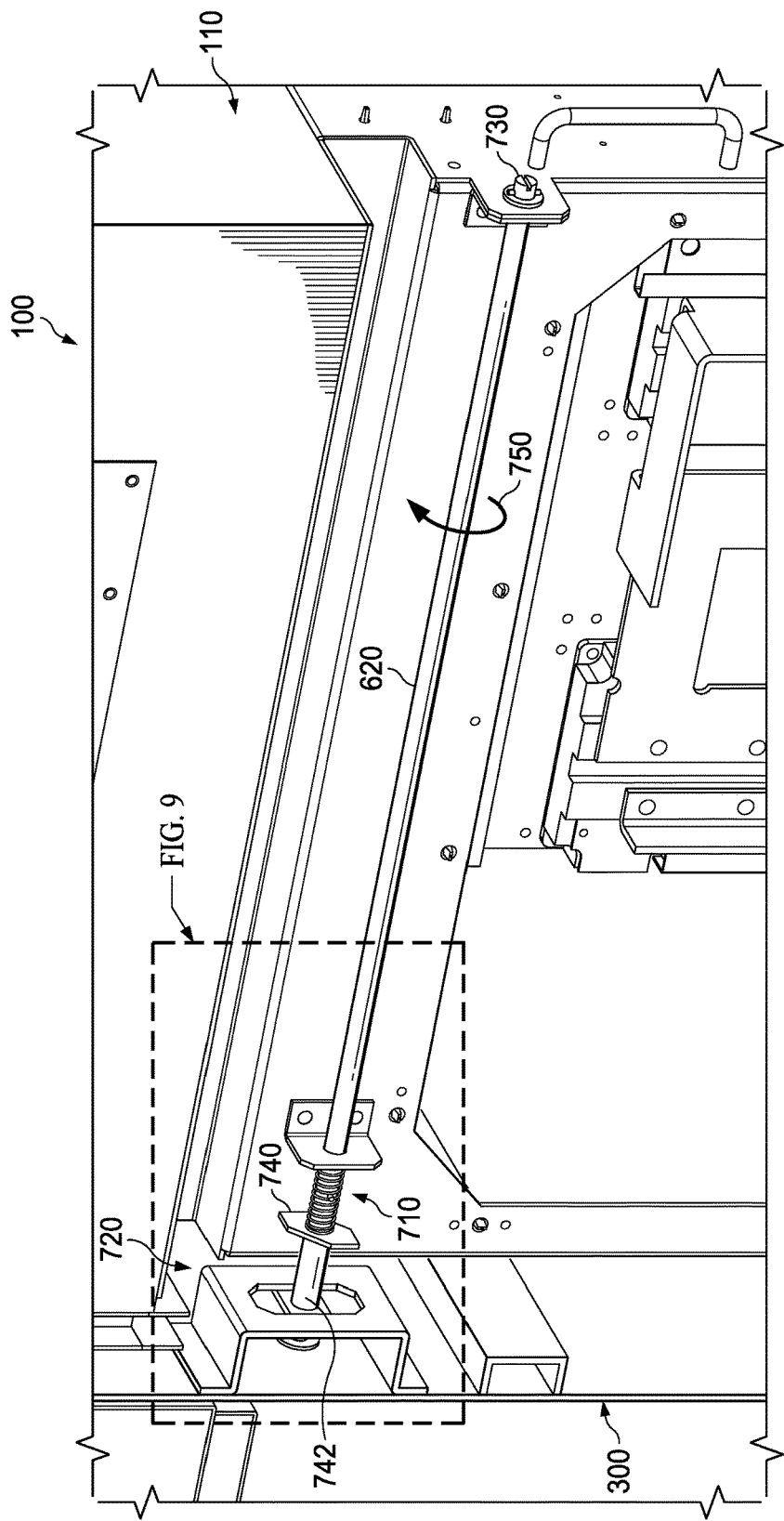
FIG. 8 is the module securing arm of FIG. 7 during make-up with a securing bracket with locking angle in a locked position, in accordance with certain embodiments of the present disclosure.
Figure 9:
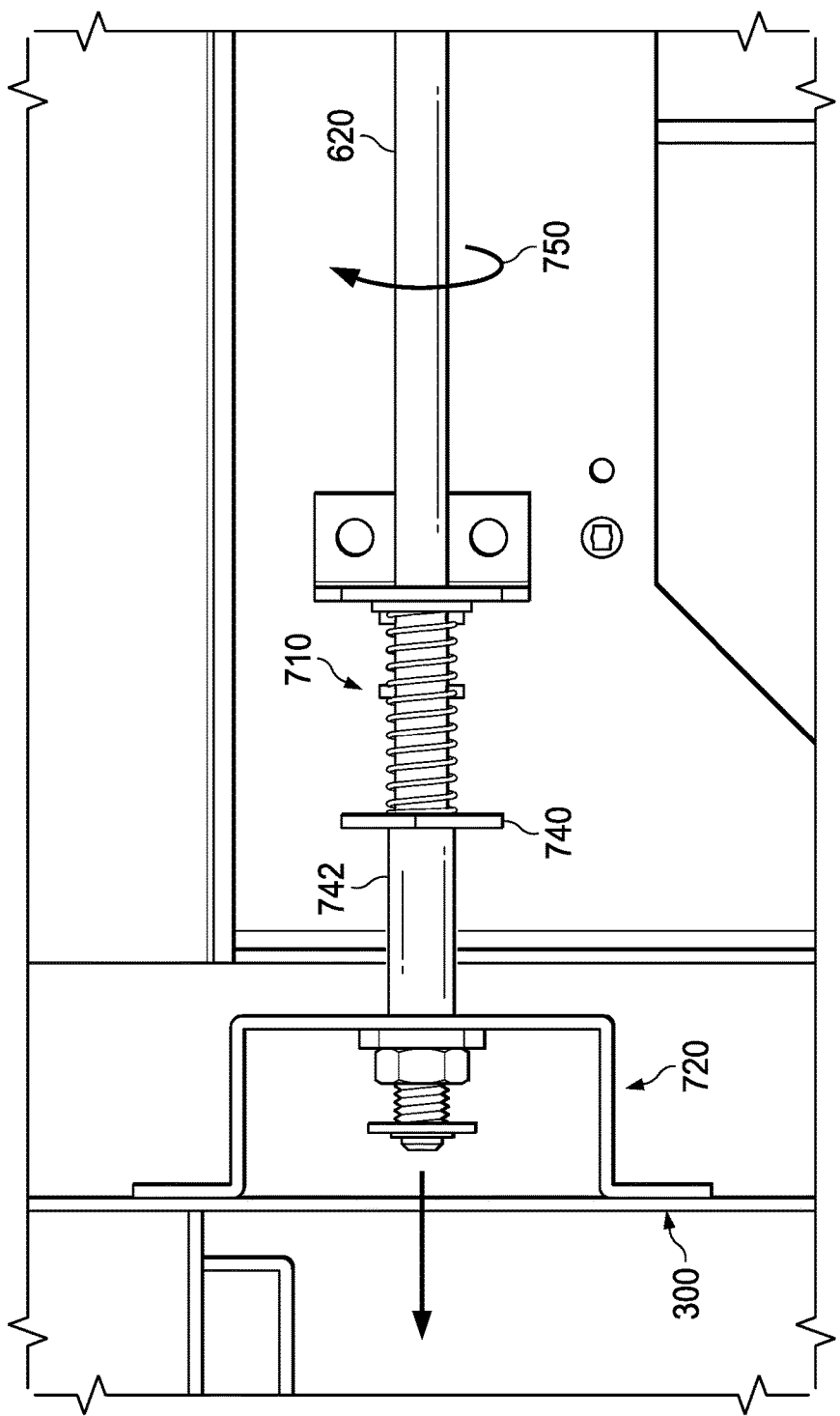
FIG. 9 is a close-up view of FIG. 8 showing the module securing arm and securing bracket during make up, in accordance with certain embodiments of the present disclosure.

FIGS. 7, 8, and 9, show a particular embodiment of lower module securing arm 620. However, a person of ordinary skill in the art would appreciate that the following disclosure could apply to module securing arms located anywhere on power module 100. Referring to FIG. 7, when the module 100 has been pushed to the back of cabinet 300, and environmentally sealable chamber 110 is flush with the cabinet openings 326 (shown in FIG. 4), a threaded end 710 of module securing arm 620 may contact a threaded portion of securing bracket 720 located on the interior frame of cabinet 300. In the embodiment shown in FIG. 7 the threaded portion of securing bracket 720 may be locking cylinder 742. module securing arm 620 may instead make initial contact with locking cylinder 742. Locking cylinder 742 may be rotationally connected to securing bracket 720 and may have a locking angle 740 attached to the end opposite of securing bracket 720.

Referring now to FIGS. 8 and 9, in this particular embodiment, module securing arm 620 and locking cylinder 742 are threaded such that making-up of the connection occurs by rotating module securing arm 620 in a clockwise direction 750. However, a person of ordinary skill in the art can appreciate that the threads may be designed to allow for other directions of rotation during make-up with the same effect. For example, as one of ordinary skill would appreciate, the module securing rod can be made to turn counterclockwise by changing the orientation of the threads on threaded portion 710 and securing bracket 720.

Locking angle 740 may work such that after initial contact is made between the threaded end 710 of module securing arm 620 and locking cylinder 742, module securing arm 620 may be rotated in a clockwise direction by way of a screwdriver (not shown) inserted into a screwdriver slot 730 on the end of module securing arm 620 opposite of threaded end 710. In such embodiments, the rotation of module securing arm 620 may cause locking angle 740 to rotate in a clockwise direction. In some embodiments, once the locking angle 740 has turned 90 degrees it may contact the outer frame of module 100. A person of ordinary skill in the art would understand that locking angle 740 can be shaped to allow for rotations greater than or less than 90 degrees before contacting outer frame of module 100. After locking angle 740 contacts the outer frame of module 100, each turn of module securing arm 620 may then engage the threads of threaded end 710 with the threads of locking cylinder 742. As module securing arm 620 is further screwed into locking cylinder 742, environmentally sealable chamber 110 may tighten against the cabinet wall containing cabinet openings 326.

As one of ordinary skill in the art would appreciate, if the evenness of total seal 124 is critical to the proper function of module 100 and environmentally sealable chamber 110, then module securing arms 610 and 620 may be adjustably tightened to different levels of tightness as required. Also, if the module 100 requires maintenance or replacement, module securing arms 610 and 620 may be unscrewed from their associated securing brackets so that module 100 may be removed from cabinet 300. This ease of installation and removal is an advantage for a power module of this size.

What is claimed is:

1. An outdoor drive comprising: a cabinet with an air intake and an air outlet in fluid communication with an interior space of said cabinet, wherein said cabinet is configured to receive a power module within said interior space, and wherein said power module comprises: a lower chamber containing electronic components, an environmentally sealable upper chamber containing a first opening configured to receive air from said air intake, a second opening configured to allow air to exit through said air outlet, a heatsink thermally coupled to said electronic components in said lower chamber; a fan capable of circulating air from said air intake over said heat sink and out said air outlet, and a module securing arm capable of securing said first and second openings of said environmentally sealable upper chamber with said air inlet and said air outlet; a support tray hingedly connected to said cabinet wherein said support tray comprises guide tracks for sliding said power module into said interior space of said cabinet.

2. The system of claim 1 wherein said first opening envelops said air intake and said second opening envelops said air outlet.

3. The system of claim 1 wherein said module securing arm comprises a rod having a first end with threads and a securing bracket on an interior surface of said cabinet having threads that are complimentary to said threads on said first end of said module securing arm, said module securing arm operable to screw into said securing bracket and tighten said power module against said interior surface.

4. The system of claim 1 further comprising four module securing arms, wherein two are located above said environmentally sealable upper chamber and two are located below said environmentally sealable upper chamber.

5. The system of claim 1 further comprising a gasket for creating an environmental seal between said air intake and said environmentally sealable upper chamber and between said air outlet and said environmentally sealable upper chamber.

6. The system of claim 1 wherein said environmentally sealable upper chamber of said power module comprises a sealable access point allowing for inspection and cleaning of said heatsink.

7. An outdoor drive comprising: a cabinet with an air intake and an air outlet in fluid communication with an interior space of said cabinet, a fan capable of circulating air from said air intake through said interior space and to said air outlet, wherein said cabinet is configured to receive a power module within said interior space, wherein said power module comprises an environmentally sealable chamber comprising: a first opening configured to receive air from said air intake, a second opening configured to allow air to exit through said air outlet, a heatsink thermally coupled to electronic components outside of said environmentally sealable chamber, and a plurality of module securing arms capable of securing said first and second openings of said environmentally sealable chamber with said air inlet and said air outlet; a support tray hingedly connected to said cabinet wherein said support tray comprises guide tracks for sliding said power module into said interior space of said cabinet.

8. The system of claim 7 wherein said first opening envelops said air intake and said second opening envelops said air outlet.

9. The system of claim 7 wherein said module securing arm comprises a rod having a first end with threads and a securing bracket on an interior surface of said cabinet having threads that are complimentary to said threads on said first end of said module securing arm, said module securing arm operable to screw into said securing bracket and tighten said power module against said interior surface of said cabinet.

10. The system of claim 7 wherein said power module has four module securing arms, wherein two are located above said environmentally sealable chamber and two are located below said environmentally sealable chamber.

11. The system of claim 7 further comprising a gasket for creating an environmental seal between said air intake and said environmentally sealable upper chamber and between said air outlet and said environmentally sealable upper chamber.

12. The system of claim 7 wherein said environmentally sealable chamber of said power module comprises a sealable access point allowing for inspection and cleaning of said heatsink.

13. A method of environmentally sealing the electronics of a power module in a cabinet of an outdoor drive comprising: drawing air, using a fan, through an air intake and into an environmentally sealable chamber of a power module, wherein said air intake is in fluid communication with said environmentally sealable chamber through a first opening of said environmentally sealable chamber, wherein said first opening is secured with said air inlet by using a plurality of module securing arms, thereby allowing air to enter only said environmentally sealable chamber; forcing the air, using the fan, over a heat sink, wherein the heat sink is thermally coupled to electronics located outside of the environmentally sealable chamber; forcing the air, using the fan, out of the environmentally sealable chamber and through an air outlet, wherein said air outlet is in fluid communication with said environmentally sealable chamber through a second opening of said environmentally sealable chamber, and wherein said second opening is secured with said air outlet by using said plurality of module securing arms, thereby allowing air to exit only said environmentally sealable chamber; a support tray hingedly connected to said cabinet wherein said support tray comprises guide tracks for sliding said power module into said interior space of said cabinet.

14. The method of claim 13 wherein said first opening envelops said air intake and said second opening envelops said air outlet, thereby allowing air to enter only said environmentally sealable chamber of said power module.

15. The method of claim 13 wherein said module securing arm comprises a rod having a first end with threads and a securing bracket on an interior surface of said cabinet having threads that are complimentary to said threads on said first end of said module securing arm, said module securing arm operable to screw into said securing bracket and tighten said power module against said interior surface.

16. The method of claim 13 wherein said power module has four module securing arms, wherein two are located above said environmentally sealable chamber and two are located below said environmentally sealable chamber.

17. The method of claim 13 wherein said cabinet further comprises a gasket for creating an environmental seal between said air intake and said environmentally sealable upper chamber and between said air outlet and said environmentally sealable upper chamber.

\* \* \* \* \*